(12) United States Patent
    Palmer

(10) Patent No.: US 10,776,201 B2
(45) Date of Patent: Sep. 15, 2020

(54) EXTENDED ERROR CORRECTION IN STORAGE DEVICE

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 16/236,094

(22) Filed: Dec. 28, 2018

(65) Prior Publication Data

US 2020/0210283 A1    Jul. 2, 2020

(51) Int. Cl.
   *G06F 11/10*    (2006.01)
   *G11C 29/52*    (2006.01)
   *G06F 12/10*    (2016.01)
   *H03M 13/29*    (2006.01)

(52) U.S. Cl.
   CPC .......... *G06F 11/1068* (2013.01); *G06F 12/10* (2013.01); *G11C 29/52* (2013.01); *H03M 13/2906* (2013.01); *G06F 2212/1044* (2013.01)

(58) Field of Classification Search
   CPC ................ G06F 11/1068; G06F 12/10; G06F 2212/1044; G11C 29/52; H03M 13/2906
   See application file for complete search history.

(56) References Cited

U.S. PATENT DOCUMENTS

| 9,244,792 | B1* | 1/2016 | Fischer | G06F 11/1088 |
| 2007/0233946 | A1* | 10/2007 | Jewett | G06F 21/80 711/112 |
| 2013/0346829 | A1* | 12/2013 | Koseki | G06F 11/1048 714/764 |
| 2014/0214970 | A1* | 7/2014 | Rasbornig | H04L 1/22 709/206 |
| 2016/0364289 | A1* | 12/2016 | Beattie | G06F 3/0619 |
| 2018/0190362 | A1* | 7/2018 | Barndt | G11C 16/3431 |
| 2020/0034307 | A1* | 1/2020 | Duzly | G11C 29/52 |

* cited by examiner

*Primary Examiner* — Guy J Lamarre
(74) *Attorney, Agent, or Firm* — Schwegman Lundberg & Woessner, P.A.

(57) ABSTRACT

Devices and techniques for extended error correction in a storage device are described herein. A first set of data, that has a corresponding logical address and physical address, is received. A second set of data can be selected based on the logical address. Secondary error correction data can be computed from the first set of data and the second set of data. Primary error correction data can be differentiated from the secondary error correction data by being computed from the first set of data and a third set of data. The third set of data can be selected based on the physical address of the first set of data. The secondary error correction data can be written to the storage device based on the logical address.

24 Claims, 5 Drawing Sheets

EXTENDED ERROR CORRECTION IN STORAGE DEVICE

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), or magnetoresistive random-access memory (MRAM), among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
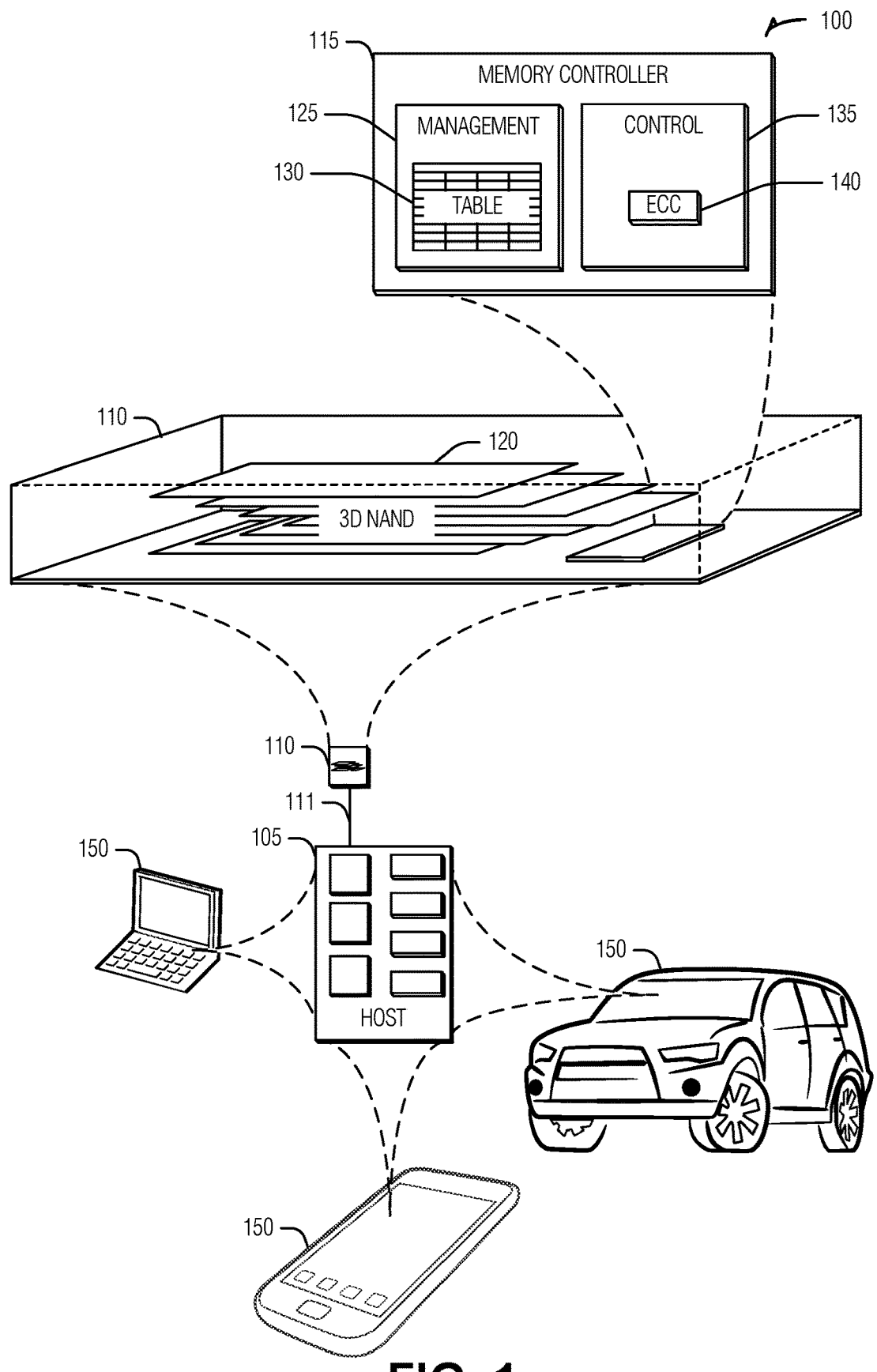
FIG. 1 illustrates an example of an environment including a memory device.

Flash memory devices have implemented error correction codes (ECC) to detect errors and, in some instances, recover from them. As device geometries continued to shrink and controller complexity increased, redundant array of independent device (RAIN) techniques were employed to supplement ECC. RAIN is conceptually related to the parity redundant array of independent drive (RAID) schemes used to protect hard drive-based storage rather than non-parity RAID because flash devices already used parallelism between devices (e.g., die, blocks, pages, etc.).

Due to limited numbers of flash (e.g., NAND) die in memory devices (e.g., two, four, or eight die), and due to design decisions to include overprovisioning (e.g., the memory device has a capacity about 6.9% greater than its advertised capacity), it is often not feasible to dedicate a die or even a plane to the parity data. To overcome this issue, parity accumulation across multiple pages in a given block has been used. Here, parity is not immediately written together (e.g., at the same time) with protected data, but rather is temporarily accumulated (e.g., in a swap block of the memory device) before being written with the protected data.

Generally, RAIN parity involves mapping defined data segments, such as a block, to a parity slot. The parity slot is generally implemented in a fast volatile memory of a memory controller for the flash device. Device data segments (e.g., pages of the block) are exclusively OR-ed (XORed) with each other as they are added to the parity slot. Often, once one of the set of defined data segments is complete (e.g., a defined grouping of pages for a block are received), the final parity value is flushed to a swap block, or the like. Once the write is completed, such as when the data is written to a block, the parity values from the swap block are generally written to the block as well. In this way, the parity values can be used to reconstruct the data written to the block in the case of error.

Although basic RAIN techniques provide protection beyond that offered by ECC or other error correction techniques, they can still result in corruption. For example, if an entire block is malfunctioning or corrupt, the data and corresponding parity data can be lost. Some RAIN techniques, such as spinning or swapping RAIN, have been proposed to alleviate these weaknesses in traditional RAIN. However, these additional techniques can be complicated or introduce other problems.

To address the issues above, those of providing a flexible error correction system for a storage device, an extended error correction technique can be employed. The extended error correction provides an additional level of error correction information to data before the data is written to the storage device. This additional level of error correction information can be orthogonal to the primary error correction information. For example, if the primary error correction information is generated based on pages that will be written to a particular storage block, the second level of error correction can be based on an error correction code or parity data from a combination of the pages to be written and pages stored in another logical block address (LBA). This creates an orthogonal level of error protection because the error correction information is spread between two logical disparate entities. In an example, the second LBA can be derived as a function of the LBA corresponding to the data to be written. Such an arrangement is efficient to compute while enabling many orthogonal options. Additional details and examples are provided below.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMCT™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 500 of FIG. 5.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110.

The memory manager 125 can include, among other things, circuitry or firmware, such as several components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a logical-to-physical (L2P) mapping.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

Figure 2:
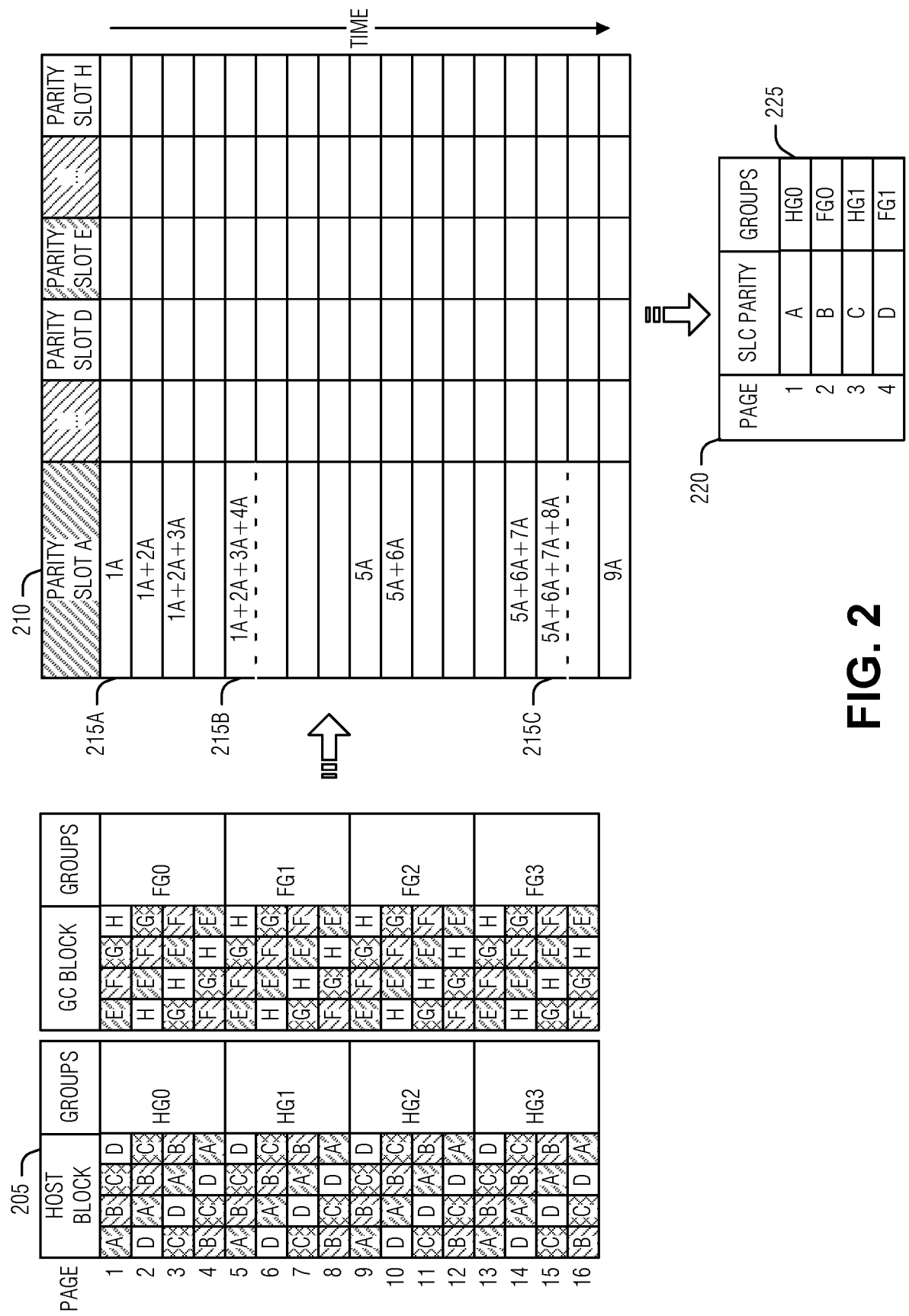
FIG. 2 illustrates an example of a parity mapping for a redundant array of independent NAND (RAIN).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance can include removing (e.g., retiring) failing memory resources (e.g., memory cells, memory arrays, pages, blocks, etc.) to prevent future errors. RAIN is another technique that can be employed by the memory device 110 to maintain data integrity. The array controller 135 can be arranged to implement RAIN parity data generation and storage in the array 120. The memory controller 115 can be involved in using the parity data to reconstruct damaged data. FIG. 2, described below, illustrates a form of RAIN called spinning RAIN.

As noted above, error correction, such as ECC or RAIN parity, among others, is generally based on the hardware devices of the array 120. Thus, ECC is generally generated for a page and stored in metadata of that page. Similarly, RAIN parity data is generated for a physical block and stored with other data in that block. While techniques such as spinning RAIN can be used to reduce the correspondence of data and hardware, the techniques can be cumbersome (e.g., complex or use additional resources) or ineffective in some cases. To augment these techniques, an extended error correction can be implemented by the memory controller 115. In an example, where the memory device 110 is not a managed device (e.g., it does not include the memory controller 115), the host 105 (e.g., processing circuitry of the host 105) can implement the memory controller 115 as described below. Also, although many examples discuss RAIN-like parity, ECC, or other error correction techniques, can be implemented in similar ways.

In general, the extended error correction includes the memory controller 115 using a different view of the data to implement an additional error correction for the data. A natural view is the logical allocation of data. Thus, instead of computing RAIN parity for the pages of a physical block, the RAIN parity is computed for the pages of a logical block. With this context in mind, the controller 115 is arranged to implement extended error correction by receiving a first set of data. Generally, the first set of data is received from the host 105 (e.g., an application running on the host 105) and represents data to be saved to the array 120. Generally, as part of the save, the host 105, or other entity interfacing with the memory device 110, provides an address. Often, the address is logical in the case of NAND storage devices. The memory controller 115 then uses the L2P data structure to resolve the logical address to a physical address. Thus, in an example, the first set of data is received with a logical address. The first set of data also has a corresponding physical address based on the logical address. In an example, the logical address has resolution of a block. In an example, the logical address is a logical block address (LBA). Block level resolution is typical in many memory devices 110. However, other address resolutions can also be used, such as page level, a group of pages, superblocks, etc.

The memory controller 115 is arranged to select a second set of data based on the logical address of the first set of data. This selection, in part, distinguishes the extended error correction from other techniques. The way in which the selection is provides flexibility in design. Some selections can be computationally efficient while other selections can provide greater diversity of input data to the error correction technique. In an example, second set of data is randomly selected. Thus, a second logical address, different than that of the first set of data, is chosen using a random technique. In an example, the domain of the selection is limited, for example, to a different die of the array 120 than that of the physical address. This can increase parallelism when reading the data and the corresponding error correction data. Random selection can be computationally efficient to select and provide good diversity of storage hardware to separate the error correction data and the user data for protection but can also involve additional complexity when tracking or retrieving the error correction data. The additional retrieval complexity, however, can be mitigated by the usually low occurrence of data reconstructions that require the extended error correction in some applications.

In an example, the second set of data is selected based on a characteristic of the logical address. Thus, an even logical address can be selected when the logical address is even and an odd logical address otherwise. This technique is computationally efficient. It is also efficient to track the relationship between data and error correction data.

In an example, the second set of data is selected such that it is a modulo of a write width of the memory device 110. Here, write width denotes the size of data accepted by the memory device 110 for writing. In an example, wherein the write width is thirty-two bits, sixty-four bits, one-hundred twenty-eight bits, or two-hundred fifty-six bits.

Once the secondary data is selected, the memory controller 115 is arranged to compute secondary error correction data the first set of data and the second set of data. The secondary error correction is different than primary error correction data, such as the ECC or RAIN based on physical device addressing described above (e.g., implemented by a combination of the memory controller 115 and the array controller 135). For example, given a third set of data selected based on the physical address corresponding to the first set of data, the primary error correction is computed from the first and third sets of data.

In an example, a single parameterized formula is used for both the secondary error correction code computation and the primary error correction code computation formula. That is to say, that the secondary error correction can use the same technique as the primary error correction but operating on different data. The parameterization refers to options for the given technique. In an example, a parameter of the single parameterized formula specifies a density of error correction data. Parity density refers to the amount of parity data for a given amount of data. The greater the parity density, the more parity data is computed for the given amount of data. Greater parity densities generally correlate to increased storage requirements for the parity data in exchange for faster or more comprehensive error correction using the parity data. Thus, if speed in error correction is important for a given user experience, then a higher parity density is often appropriate. If, however, the extended error correction is infrequently used, then a slower reconstruction with lower parity data storage use is often appropriate. In an example, the parameter of the parametrized formula specifies a lower density of error correction data for the secondary error correction data than for the primary error correction data.

The memory controller 115 is arranged to write the secondary error correction to the array 120 based on the logical address. Thus, the secondary error correction is derived from the logical domain, as opposed to the physical domain. The second set of data is selected based on the logical address, and the computed secondary error correction is stored based on the logical address.

In an example, the memory controller 115 can use a different technique to select input data to compute additional (e.g., tertiary) error correction data (e.g., beyond the secondary error correction). Again, this technique is based on the logical address. In an example, a different formula can be used to compute the extended error correction using the first set of data and the data selected using the different technique, here a fourth set of data. Once the tertiary error correction data is computed from the first set of data and the fourth set of data, the memory controller 115 can store it in the array 120 based on the logical address. The additional layering of error corrections, each having different parity densities, for example, provides a flexible technique of training efficiency and data integrity where needed.

Once stored, the extended error correction data (e.g., the secondary error correction, tertiary error correction, etc.) can be used by the memory controller 115 or other entity (e.g., the host 105) to repair data. Thus, in an example, the memory controller 115 is arranged to receive an indication that a read failed after using the primary error correction code data. The memory controller 115 can perform error correction on the retrieved data of the failed read using the extended error correction data to produce correct data. The correct data can then be returned to a calling entity (e.g., the host 105).

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

FIG. 2 illustrates an example of a parity mapping for a redundant array of independent NAND (RAIN). The logical-to-physical mapping 205 illustrates a striped logical block across four physical blocks of, for example, a plane in a NAND flash die—this arrangement can be called spinning RAIN. Thus, logical block A occupies page one of physical block one, page two of physical block two, and so on as illustrated. Similarly, logical block D occupies page one of physical block four, page 2 of physical block one, and so on as illustrated. Also, as illustrated, the pages of a logical block can be grouped based on the modulus of the number of physical blocks across which the logical block is striped. Thus, the first four pages of logical block A when striped across four physical blocks, can be grouped (e.g., the illustrated group HG0). Not only can the user data (e.g., host blocks) be stripped, but the garbage collection blocks (e.g., GC blocks) can also be stripped and protected by RAIN parity.

The logical blocks are mapped to a parity slot 210 in memory of the memory controller. The mapping was often based on a direct manipulation of an attribute of the logical block to avoid the overhead of tracking the parity slot 210 to logical block mapping. Generally, the parity slot 210 is sized for a smallest unit of parity. Thus, where pages are XORed for parity, the parity slot 210 is the size of one page.

In operation, the contents of the parity slot 210 changes over time as additional pages of the logical block are added. Thus, the parity slot value at a first time 215A starts with the first page of logical block A (e.g., 1A). As time progresses, the value in the parity slot is changed to be a combination of a previous value and a current page of the logical block. Thus, the XOR result of pages 1A and 2A is XORed with the page 3A when page 3A arrives. This continues, if there is a page for the logical block, until the group is done, or some other criteria is met and the parity slot value at a second time 215B is flushed to a swap block 220, at a page 225 corresponding to the logical block (here A) and the group (here HG0). The third time 215C also correlates to another value that is flushed on group HG1. After a flush, the parity slot 210 is reset (e.g., erased, emptied, etc.) and parity accumulation begins again.

The swap block 220 is typically flash storage used as a workspace for the parity accumulation. When the logical block is completely written to physical blocks, then the parity data for the logical block is typically written to the physical blocks as well to collocate it with the data to which it pertains. Typically, the swap block 220 is SLC encoded for speed, as opposed to the MLC (e.g., TLC) encoding of the physical blocks ultimately holding the data or parity data.

As illustrated, the empty cells for the parity slot 210 represent time increments in which the value in the parity slot 210 did not change. It is this feature that can lead to a need for large memory controller memories (e.g., to maintain parity slots for all of the logical blocks A, B, C, and D) being written.

Figure 3:
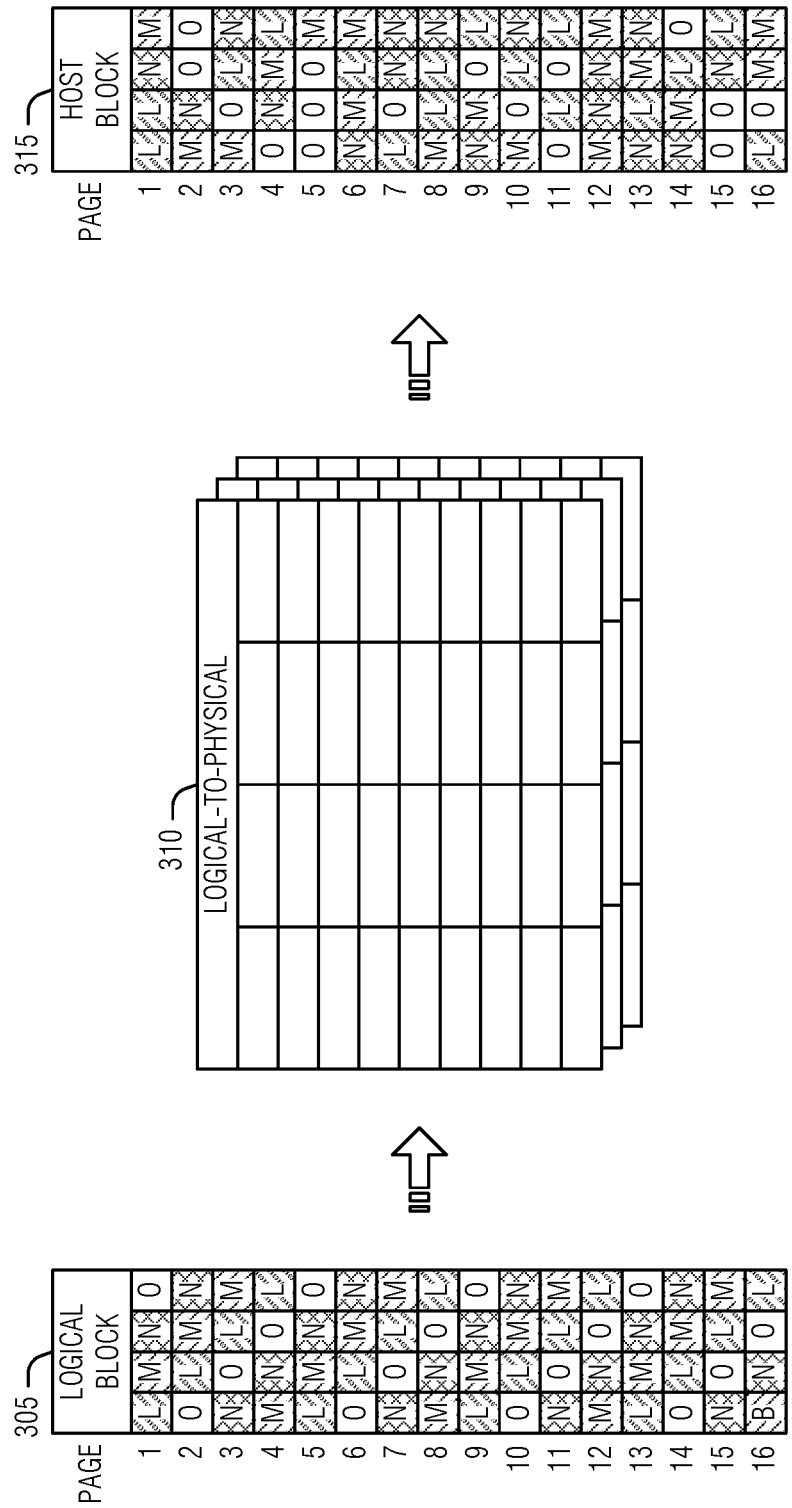
FIG. 3 illustrates an example of an extended error correction mapping.

FIG. 3 illustrates an example of an extended error correction mapping. The example RAIN arrangement illustrated in FIG. 2 and described above represents the physical block allocation of logical block pages striped across physical blocks. In the context of RAIN, typically the striping is enforced at the physical block level. Thus, chunks (e.g., pages) of data are XORed with each other to make the parity data and this parity data is based on physical data layouts—e.g., all of the same pages across a set of blocks.

In contrast to the example illustrated in FIG. 2, the data for a logical block, such as Virtual Block L, is diagonally striped as illustrated in the logical block allocation 305, somewhat mirroring the physical block striping of FIG. 2. As illustrated, an additional set of parity data is computed across the logical block allocation (e.g., in the logical, not physical, space). Thus, the LBAs have parity calculated and made part of the data that arrives at, for example, an array controller of the storage device to calculate parity based on the physical blocks. As the logical blocks are mapped to physical blocks via the L2P table 310 to produce the physical block allocation 315, it is clear that the striped pattern is modified by the device operation as expressed in the L2P table. This provides an orthogonal parity allocation to the physical striping of FIG. 2.

The logical block-based parity enables additional error correction information that can be re-built using the logical domain, helping to remove dependency on particular physical domain strategies for error correction information. For example, the parity relationship between LBAs is fixed while the underlying physical block allocation is nearly continuously changing due operation of a NAND storage device.

Further, additional parities—such as at a higher level, e.g., computing parity on page groups of superblocks—can be added. To address the additional data consumption by adding more parity, the different levels of error correction information can be tailored to address their likely use cases. Thus, the ratio of parity data to data can be reduced at higher levels. Although such an arrangement generally leads to a more complex error recovery, it is an acceptable exchange because it generally would not be used and reduces storage use for the parity data.

Although RAIN type parity is discussed in this example, other parity techniques can be implemented with the same type of tiered technique. For example, Hamming codes, or other ECC, can be applied to a group of logical pages in logical blocks to extend the error correction for the data.

Figure 4:
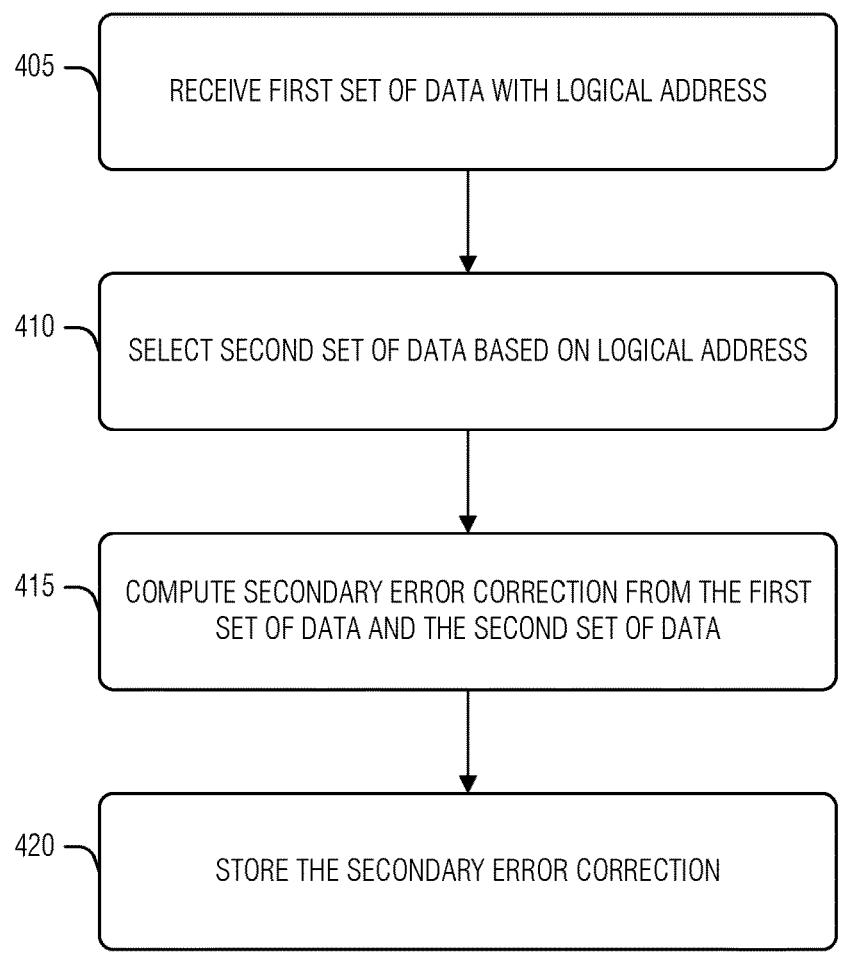
FIG. 4 illustrates a flowchart of a method for extended error correction in a storage device.

FIG. 4 illustrates a flowchart of a method 400 for extended error correction in a storage device. The operations of the method 400 are performed by computer hardware, such as that described above (e.g., a memory controller, an array controller, etc.) or below (e.g., processing circuitry).

At operation 405, a first set of data is received. Here, the first set of data has a corresponding logical address and a corresponding physical address. In an example, the logical address has resolution of a block. In an example, the logical address is a logical block address (LBA).

At operation 410, a second set of data is selected based on the logical address corresponding to the first set of data. In an example, selecting the second set of data includes randomly selecting a second logical address of the storage device that is not the logical address. In an example, selecting the second set of data includes selecting an even logical address of the storage device when the logical address is even and selecting an odd logical address otherwise.

In an example, selecting the second set of data includes selecting a second logical address of the storage device that is a modulo of a write width of the storage device. In an example, wherein the write width is at least one of thirty-two bits, sixty-four bits, one-hundred twenty-eight bits, or two-hundred fifty-six bits.

At operation 415, secondary error correction data is computed from the first set of data and the second set of data. Here, primary error correction data is differentiated from the secondary error correction data by being computed from the first set of data and a third set of data. The third set of data is selected based on the physical address corresponding to the first set of data. In an example, a single parameterized formula is used for both the secondary error correction code computation and the primary error correction code computation formula. In an example, a parameter of the single parameterized formula specifies a density of error correction data. In an example, the parameter specifies a lower density of error correction data for the secondary error correction data than for the primary error correction data.

At operation 420, the secondary error correction data is written to the storage device based on the logical address. In an example, the storage device is a NAND flash device.

In an example, the operations of the method 400 can be extended to include selecting a fourth set of data based on the logical address. In an example, the fourth set of data is selected using a different technique than one used to select the second set of data.

Tertiary error correction data can then be computed from the first set of data and the fourth set of data. The tertiary error correction data can be written to the storage device based on the logical address.

In an example, the method 400 can include an operation of receiving an indication that a read of the storage device failed after using the primary error correction code data. Error correction can be performed on retrieved data of the failed read using the secondary error correction data to produce correct data. The correct data can then be returned to a calling entity (e.g., the host).

Figure 5:
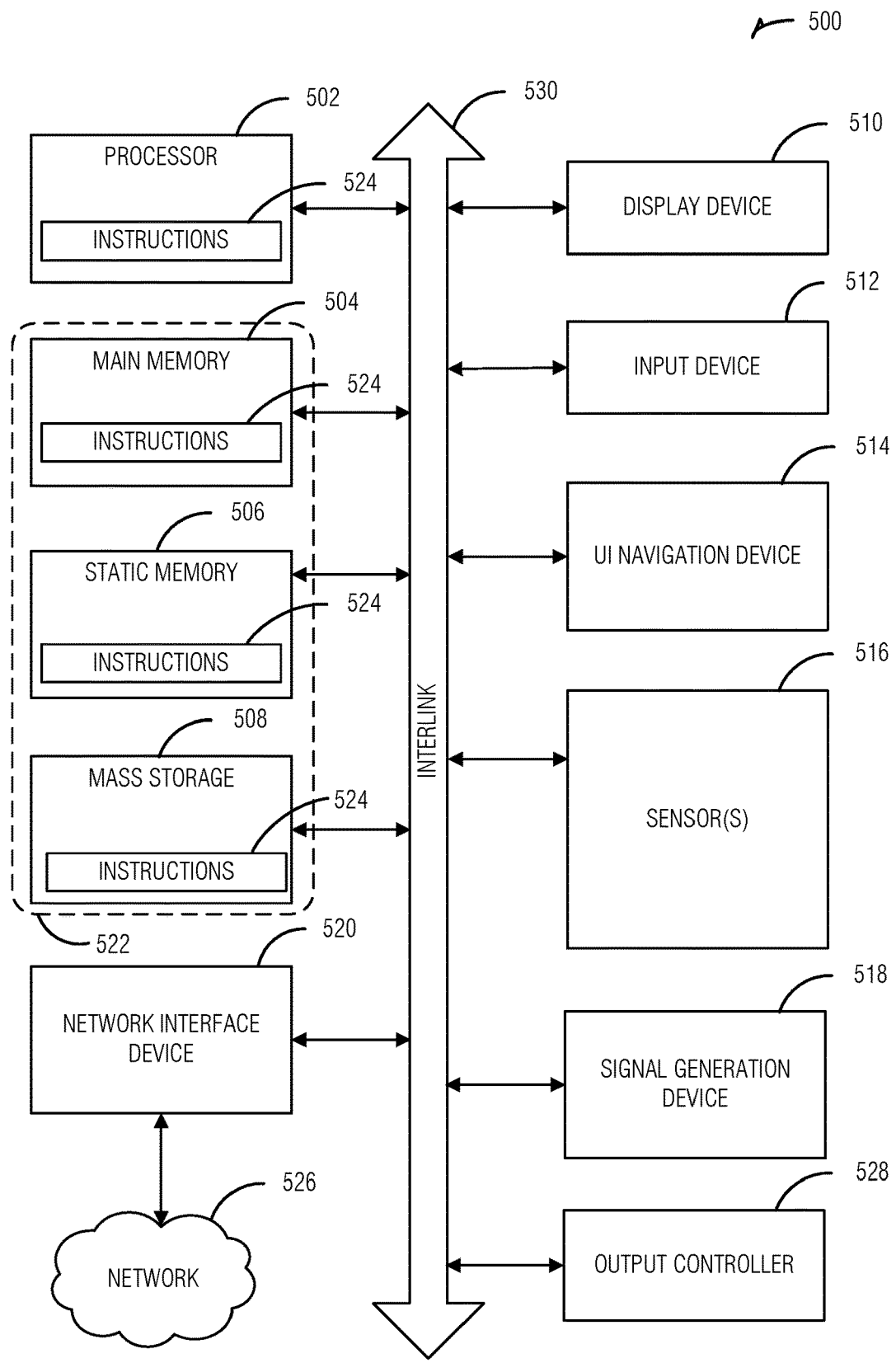
FIG. 5 is a block diagram illustrating an example of a machine upon which one or more embodiments can be implemented.

FIG. 5 illustrates a block diagram of an example machine 500 upon which any one or more of the techniques (e.g., methodologies) discussed herein can perform. In alternative embodiments, the machine 500 can operate as a standalone device or can be connected (e.g., networked) to other machines. In a networked deployment, the machine 500 can operate in the capacity of a server machine, a client machine, or both in server-client network environments. In an example, the machine 500 can act as a peer machine in peer-to-peer (P2P) (or other distributed) network environment. The machine 500 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) can include a hardware processor 502 (e.g., a central processing unit (CPU), a graphics processing unit (GPU), a hardware processor core, or any combination thereof, such as the memory controller 115, etc.), a main memory 504 and a static memory 506, some or all of which can communicate with each other via an interlink (e.g., bus) 508. The machine 500 can further include a display unit 510, an alphanumeric input device 512 (e.g., a keyboard), and a user interface (UI) navigation device 514 (e.g., a mouse). In an example, the display unit 510, input device 512 and UI navigation device 514 can be a touch screen display. The machine 500 can additionally include a storage device (e.g., drive unit) 508, a signal generation device 518 (e.g., a speaker), a network interface device 520, and one or more sensors 516, such as a global positioning system (GPS) sensor, compass, accelerometer, or other sensor. The machine 500 can include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 508 can include a machine readable medium 522 on which is stored one or more sets of data structures or instructions 524 (e.g., software) embodying or utilized by any one or more of the techniques or functions described herein. The instructions 524 can also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 508 can constitute the machine readable medium 522.

While the machine readable medium 522 is illustrated as a single medium, the term "machine readable medium" can include a single medium or multiple media (e.g., a centralized or distributed database, or associated caches and servers) configured to store the one or more instructions 524.

The term "machine readable medium" can include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage 521 device is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging takes place in the compressed block until it is necessary to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 can further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks) such as those defined by the Third Generation Partnership Project (3GPP) families of standards (e.g., 3G, 4G, 5G, Long Term Evolution (LTE), etc.), Plain Old Telephone (POTS) networks, and wireless data networks (e.g., Institute of Electrical and Electronics Engineers (IEEE) 802.11 family of standards known as Wi-Fi®), IEEE 802.15.4 family of standards, peer-to-peer (P2P) networks, among others. In an example, the network interface device 520 can include one or more physical jacks (e.g., Ethernet, coaxial, or phone jacks) or one or more antennas to connect to the communications network 526. In an example, the network interface device 520 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that can store, encoding or carrying instructions for execution by the machine 500, and includes digital or analog communications signals or other intangible medium to facilitate communication of such software.

ADDITIONAL EXAMPLES

Example 1 is a memory controller for extended error correction in a storage device, the memory controller comprising: an interface to communicate with the storage device; and processing circuitry to: receive a first set of data, the first set of data having a corresponding logical address and a corresponding physical address; select a second set of data based on the logical address; compute secondary error correction data from the first set of data and the second set of data, primary error correction data differentiated from the secondary error correction data by being computed from the first set of data and a third set of data, the third set of data selected based on the physical address; and write, via the interface, the secondary error correction data to the storage device based on the logical address.

In Example 2, the subject matter of Example 1, wherein the storage device is a NAND flash device.

In Example 3, the subject matter of any of Examples 1-2, wherein the logical address has resolution of a block, the logical address being a logical block address (LBA).

In Example 4, the subject matter of any of Examples 1-3, wherein, to select the second set of data based on the logical address, the processing circuitry is arranged to randomly select a second logical address of the storage device that is not the logical address.

In Example 5, the subject matter of any of Examples 1-4, wherein, to select the second set of data based on the logical address, the processing circuitry is arranged to select an even logical address of the storage device when the logical address is even and selecting an odd logical address otherwise.

In Example 6, the subject matter of any of Examples 1-5, wherein, to select the second set of data based on the logical address, the processing circuitry is arranged to select a second logical address of the storage device that is a modulo of a write width of the storage device.

In Example 7, the subject matter of Example 6, wherein the write width is at least one of thirty-two bits, sixty-four bits, one-hundred twenty-eight bits, or two-hundred fifty-six bits.

In Example 8, the subject matter of any of Examples 1-7, wherein a single parameterized formula is used for both the secondary error correction code computation and the primary error correction code computation formula.

In Example 9, the subject matter of Example 8, wherein a parameter of the single parameterized formula specifies a density of error correction data.

In Example 10, the subject matter of Example 9, wherein the parameter specifies a lower density of error correction data for the secondary error correction data than for the primary error correction data.

In Example 11, the subject matter of any of Examples 1-10, wherein the processing circuitry is arranged to: select a fourth set of data based on the logical address; compute tertiary error correction data from the first set of data and the fourth set of data; and write the tertiary error correction data to the storage device based on the logical address.

In Example 12, the subject matter of Example 11, wherein, to select the second set of data based on the logical address, the processing circuitry is arranged to use a different technique than one used to select the second set of data.

In Example 13, the subject matter of any of Examples 1-12, wherein the processing circuitry is arranged to: receive an indication that a read of the storage device failed after using the primary error correction code data; perform error correction on retrieved data of the read using the secondary error correction data to produce correct data; and return the correct data.

Example 14 is a method for extended error correction in a storage device, the method comprising: receiving a first set of data, the first set of data having a corresponding logical address and a corresponding physical address; selecting a second set of data based on the logical address; computing secondary error correction data from the first set of data and the second set of data, primary error correction data differentiated from the secondary error correction data by being computed from the first set of data and a third set of data, the third set of data selected based on the physical address; and writing the secondary error correction data to the storage device based on the logical address.

In Example 15, the subject matter of Example 14, wherein the storage device is a NAND flash device.

In Example 16, the subject matter of any of Examples 14-15, wherein the logical address has resolution of a block, the logical address being a logical block address (LBA).

In Example 17, the subject matter of any of Examples 14-16, wherein selecting the second set of data based on the logical address includes randomly selecting a second logical address of the storage device that is not the logical address.

In Example 18, the subject matter of any of Examples 14-17, wherein selecting the second set of data based on the logical address includes selecting an even logical address of the storage device when the logical address is even and selecting an odd logical address otherwise.

In Example 19, the subject matter of any of Examples 14-18, wherein selecting the second set of data based on the logical address includes selecting a second logical address of the storage device that is a modulo of a write width of the storage device.

In Example 20, the subject matter of Example 19, wherein the write width is at least one of thirty-two bits, sixty-four bits, one-hundred twenty-eight bits, or two-hundred fifty-six bits.

In Example 21, the subject matter of any of Examples 14-20, wherein a single parameterized formula is used for both the secondary error correction code computation and the primary error correction code computation formula.

In Example 22, the subject matter of Example 21, wherein a parameter of the single parameterized formula specifies a density of error correction data.

In Example 23, the subject matter of Example 22, wherein the parameter specifies a lower density of error correction data for the secondary error correction data than for the primary error correction data.

In Example 24, the subject matter of any of Examples 14-23, comprising: selecting a fourth set of data based on the logical address; computing tertiary error correction data from the first set of data and the fourth set of data; and writing the tertiary error correction data to the storage device based on the logical address.

In Example 25, the subject matter of Example 24, wherein selecting the fourth set of data includes using a different technique than one used to select the second set of data.

In Example 26, the subject matter of any of Examples 14-25, comprising: receiving an indication that a read of the storage device failed after using the primary error correction code data; performing error correction on retrieved data of the read using the secondary error correction data to produce correct data; and returning the correct data.

Example 27 is a machine readable medium including instructions for extended error correction in a storage device, the instructions, when executed by processing circuitry, cause the processing circuitry to perform operations comprising: receiving a first set of data, the first set of data having a corresponding logical address and a corresponding physical address; selecting a second set of data based on the logical address; computing secondary error correction data from the first set of data and the second set of data, primary error correction data differentiated from the secondary error correction data by being computed from the first set of data and a third set of data, the third set of data selected based on the physical address; and writing the secondary error correction data to the storage device based on the logical address.

In Example 28, the subject matter of Example 27, wherein the storage device is a NAND flash device.

In Example 29, the subject matter of any of Examples 27-28, wherein the logical address has resolution of a block, the logical address being a logical block address (LBA).

In Example 30, the subject matter of any of Examples 27-29, wherein selecting the second set of data based on the logical address includes randomly selecting a second logical address of the storage device that is not the logical address.

In Example 31, the subject matter of any of Examples 27-30, wherein selecting the second set of data based on the logical address includes selecting an even logical address of the storage device when the logical address is even and selecting an odd logical address otherwise.

In Example 32, the subject matter of any of Examples 27-31, wherein selecting the second set of data based on the logical address includes selecting a second logical address of the storage device that is a modulo of a write width of the storage device.

In Example 33, the subject matter of Example 32, wherein the write width is at least one of thirty-two bits, sixty-four bits, one-hundred twenty-eight bits, or two-hundred fifty-six bits.

In Example 34, the subject matter of any of Examples 27-33, wherein a single parameterized formula is used for both the secondary error correction code computation and the primary error correction code computation formula.

In Example 35, the subject matter of Example 34, wherein a parameter of the single parameterized formula specifies a density of error correction data.

In Example 36, the subject matter of Example 35, wherein the parameter specifies a lower density of error correction data for the secondary error correction data than for the primary error correction data.

In Example 37, the subject matter of any of Examples 27-36, wherein the operations comprise: selecting a fourth set of data based on the logical address; computing tertiary error correction data from the first set of data and the fourth set of data; and writing the tertiary error correction data to the storage device based on the logical address.

In Example 38, the subject matter of Example 37, wherein selecting the fourth set of data includes using a different technique than one used to select the second set of data.

In Example 39, the subject matter of any of Examples 27-38, wherein the operations comprise: receiving an indication that a read of the storage device failed after using the primary error correction code data; performing error correction on retrieved data of the read using the secondary error correction data to produce correct data; and returning the correct data.

Example 40 is a system for extended error correction in a storage device, the system comprising: means for receiving a first set of data, the first set of data having a corresponding logical address and a corresponding physical address; means for selecting a second set of data based on the logical address; means for computing secondary error correction data from the first set of data and the second set of data, primary error correction data differentiated from the secondary error correction data by being computed from the first set of data and a third set of data, the third set of data selected based on the physical address; and means for writing the secondary error correction data to the storage device based on the logical address.

In Example 41, the subject matter of Example 40, wherein the storage device is a NAND flash device.

In Example 42, the subject matter of any of Examples 40-41, wherein the logical address has resolution of a block, the logical address being a logical block address (LBA).

In Example 43, the subject matter of any of Examples 40-42, wherein the means for selecting the second set of data based on the logical address include means for randomly selecting a second logical address of the storage device that is not the logical address.

In Example 44, the subject matter of any of Examples 40-43, wherein the means for selecting the second set of data based on the logical address include means for selecting an even logical address of the storage device when the logical address is even and selecting an odd logical address otherwise.

In Example 45, the subject matter of any of Examples 40-44, wherein the means for selecting the second set of data based on the logical address include means for selecting a second logical address of the storage device that is a modulo of a write width of the storage device.

In Example 46, the subject matter of Example 45, wherein the write width is at least one of thirty-two bits, sixty-four bits, one-hundred twenty-eight bits, or two-hundred fifty-six bits.

In Example 47, the subject matter of any of Examples 40-46, wherein a single parameterized formula is used for both the secondary error correction code computation and the primary error correction code computation formula.

In Example 48, the subject matter of Example 47, wherein a parameter of the single parameterized formula specifies a density of error correction data.

In Example 49, the subject matter of Example 48, wherein the parameter specifies a lower density of error correction data for the secondary error correction data than for the primary error correction data.

In Example 50, the subject matter of any of Examples 40-49, comprising: means for selecting a fourth set of data based on the logical address; means for computing tertiary error correction data from the first set of data and the fourth set of data; and means for writing the tertiary error correction data to the storage device based on the logical address.

In Example 51, the subject matter of Example 50, wherein the means for selecting the fourth set of data include means for using a different technique than one used to select the second set of data.

In Example 52, the subject matter of any of Examples 40-51, comprising: means for receiving an indication that a read of the storage device failed after using the primary error correction code data; means for performing error correction on retrieved data of the read using the secondary error correction data to produce correct data; and means for returning the correct data.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory controller for extended error correction in a storage device, the memory controller comprising:
   an interface to communicate with the storage device; and
   processing circuitry to:
      receive a first set of data, the first set of data having a corresponding logical address and a corresponding physical address;
      select a second set of data based on the logical address;
      compute secondary error correction data from the first set of data and the second set of data, primary error correction data differentiated from the secondary error correction data by being computed from the first set of data and a third set of data, the third set of data selected based on the physical address; and
      write, via the interface, the secondary error correction data to the storage device based on the logical address.

2. The memory controller of claim 1, wherein the logical address has resolution of a block, the logical address being a logical block address (LBA).

3. The memory controller of claim 1, wherein, to select the second set of data based on the logical address, the processing circuitry is arranged to randomly select a second logical address of the storage device that is not the logical address.

4. The memory controller of claim 1, wherein, to select the second set of data based on the logical address, the processing circuitry is arranged to select an even logical address of the storage device when the logical address is even and selecting an odd logical address otherwise.

5. The memory controller of claim 1, wherein, to select the second set of data based on the logical address, the processing circuitry is arranged to select a second logical address of the storage device that is a modulo of a write width of the storage device.

6. The memory controller of claim 1, wherein a single parameterized formula is used for both the secondary error correction code computation and the primary error correction code computation formula.

7. The memory controller of claim 6, wherein a parameter of the single parameterized formula specifies a density of error correction data.

8. The memory controller of claim 7, wherein the parameter specifies a lower density of error correction data for the secondary error correction data than for the primary error correction data.

9. A method for extended error correction in a storage device, the method comprising:
receiving a first set of data, the first set of data having a corresponding logical address and a corresponding physical address;
selecting a second set of data based on the logical address;
computing secondary error correction data from the first set of data and the second set of data, primary error correction data differentiated from the secondary error correction data by being computed from the first set of data and a third set of data, the third set of data selected based on the physical address; and
writing the secondary error correction data to the storage device based on the logical address.

10. The method of claim 9, wherein the logical address has resolution of a block, the logical address being a logical block address (LBA).

11. The method of claim 9, wherein selecting the second set of data based on the logical address includes randomly selecting a second logical address of the storage device that is not the logical address.

12. The method of claim 9, wherein selecting the second set of data based on the logical address includes selecting an even logical address of the storage device when the logical address is even and selecting an odd logical address otherwise.

13. The method of claim 9, wherein selecting the second set of data based on the logical address includes selecting a second logical address of the storage device that is a modulo of a write width of the storage device.

14. The method of claim 9, wherein a single parameterized formula is used for both the secondary error correction code computation and the primary error correction code computation formula.

15. The method of claim 14, wherein a parameter of the single parameterized formula specifies a density of error correction data.

16. The method of claim 15, wherein the parameter specifies a lower density of error correction data for the secondary error correction data than for the primary error correction data.

17. A machine readable medium including instructions for extended error correction in a storage device, the instructions, when executed by processing circuitry, cause the processing circuitry to perform operations comprising:
receiving a first set of data, the first set of data having a corresponding logical address and a corresponding physical address;
selecting a second set of data based on the logical address;
computing secondary error correction data from the first set of data and the second set of data, primary error correction data differentiated from the secondary error correction data by being computed from the first set of data and a third set of data, the third set of data selected based on the physical address; and
writing the secondary error correction data to the storage device based on the logical address.

18. The machine readable medium of claim 17, wherein the logical address has resolution of a block, the logical address being a logical block address (LBA).

19. The machine readable medium of claim 17, wherein selecting the second set of data based on the logical address includes randomly selecting a second logical address of the storage device that is not the logical address.

20. The machine readable medium of claim 17, wherein selecting the second set of data based on the logical address includes selecting an even logical address of the storage device when the logical address is even and selecting an odd logical address otherwise.

21. The machine readable medium of claim 17, wherein selecting the second set of data based on the logical address includes selecting a second logical address of the storage device that is a modulo of a write width of the storage device.

22. The machine readable medium of claim 17, wherein a single parameterized formula is used for both the secondary error correction code computation and the primary error correction code computation formula.

23. The machine readable medium of claim 22, wherein a parameter of the single parameterized formula specifies a density of error correction data.

24. The machine readable medium of claim 23, wherein the parameter specifies a lower density of error correction data for the secondary error correction data than for the primary error correction data.

* * * * *